(12) United States Patent
He (10) Patent No.: US 11,372,281 B2
(45) Date of Patent: Jun. 28, 2022

(54) DISPLAY PANEL AND TERMINAL DEVICE

(71) Applicant: BEIJING XIAOMI MOBILE SOFTWARE CO., LTD., Beijing (CN)

(72) Inventor: Quanhua He, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/699,478

(22) Filed: Nov. 29, 2019

(65) Prior Publication Data

US 2021/0063808 A1 Mar. 4, 2021

(30) Foreign Application Priority Data

Aug. 30, 2019 (CN) .......................... 201910816172.9

(51) Int. Cl.
*G02F 1/1335* (2006.01)
*H01L 27/32* (2006.01)

(52) U.S. Cl.
CPC .. *G02F 1/133514* (2013.01); *G02F 1/133512* (2013.01); *H01L 27/3211* (2013.01)

(58) Field of Classification Search
CPC ......... G02F 1/133514; G02F 1/133512; G02F 1/13318; G02F 2001/133614; G02F 2201/58; H01L 33/50; H01L 33/507; H01L 27/322; F21K 9/64; H01J 2329/323

See application file for complete search history.

(56) References Cited

U.S. PATENT DOCUMENTS

| | | | |
|---|---|---|---|
| 2009/0128529 A1 | 5/2009 | Izumi et al. | |
| 2012/0032169 A1* | 2/2012 | Han | H01L 31/1129 257/53 |
| 2017/0154927 A1* | 6/2017 | Jo | H01L 51/441 |
| 2018/0107069 A1* | 4/2018 | Lee | G02F 1/133555 |
| 2018/0120614 A1 | 5/2018 | Shin et al. | |

FOREIGN PATENT DOCUMENTS

| | | |
|---|---|---|
| CN | 104752462 A | 7/2015 |
| EP | 2144293 A2 | 1/2010 |
| JP | 2007248816 A | 9/2007 |

OTHER PUBLICATIONS

Definition "ambient lighting," Oxford Lexico Dictionary, definition downloaded from www.lexico.com on Feb. 12, 2021 (Year: 2021).*
Definition of "ambient lighting," downloaded from The Oxford Lexico Dictionary at http://lexico.com/en/definition/ambient_lighting on Feb. 21, 2021. (Year: 2021).*

* cited by examiner

Primary Examiner — Angela K Davison
(74) *Attorney, Agent, or Firm* — Syncoda LLC; Feng Ma (57) ABSTRACT

A display panel includes: a substrate, a pixel layer and a sensing layer. The pixel layer is disposed on the substrate. The pixel layer includes pixel units arranged in an array. The sensing layer is disposed on one side of the substrate away from the pixel layer or disposed on one side of the substrate close to the pixel layer and is configured to convert a received optical signal into an electrical signal.

16 Claims, 7 Drawing Sheets

DISPLAY PANEL AND TERMINAL DEVICE

CROSS-REFERENCE TO RELATED APPLICATION

This application claims priority to Chinese Patent Application 201910816172.9 filed on Aug. 30, 2019, the disclosure of which is hereby incorporated by reference in its entirety.

BACKGROUND

An optical sensor is generally assembled on a terminal device having a screen and configured to detect the intensity of ambient light, so as to adjust the intensity of backlight according to the intensity of the ambient light. The display effect of the screen can therefore be adjusted to within a comfortable brightness range acceptable to the human eyes. For example, in a mobile phone using a liquid-crystal display (LCD), the optical sensor is disposed at the position of a frame and under a glass cover, and is arranged in a horizontal plane with the backlight board. In a mobile phone using an organic light-emitting diode (OLED) display, the optical sensor is typically disposed at the position of a frame or under the OLED display.

SUMMARY

The present disclosure relates generally to the technical field of display technologies, and more specifically to a display panel and a terminal device.

Various embodiments of the present disclosure provide a display panel and a terminal device for reducing the cost of the terminal device in detecting the optical parameters of ambient light.

According to a first aspect of embodiments of the present disclosure, there is provided a display panel, including: a substrate; a pixel layer being disposed on the substrate and including pixel units arranged in an array; and a sensing layer disposed on one side of the substrate away from the pixel layer or disposed on one side of the substrate close to the pixel layer and configured to convert a received optical signal into an electrical signal.

According to a second aspect of embodiments of the present disclosure, there is provided a terminal device, including: a device body; and the foregoing display panel; wherein the display panel covers the device body.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this disclosure, illustrate embodiments consistent with the disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

It is typically necessary to add an independent element (optical sensor) to detect the optical parameters of the ambient light, which not only increases the cost but also reduces the screen-to-body ratio of the terminal device due to the large additional space occupied by the independent element.

Figure 1:
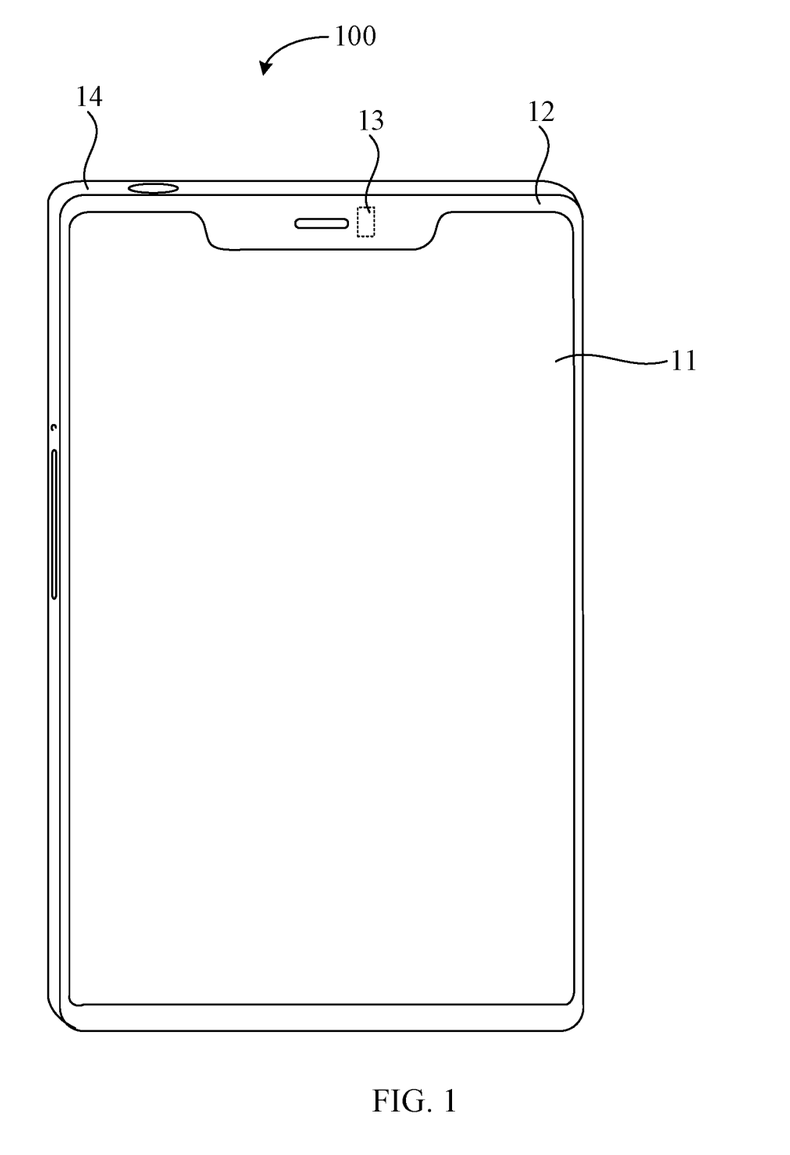
FIG. 1 is a first structural schematic view illustrating a terminal device.
Figure 2:
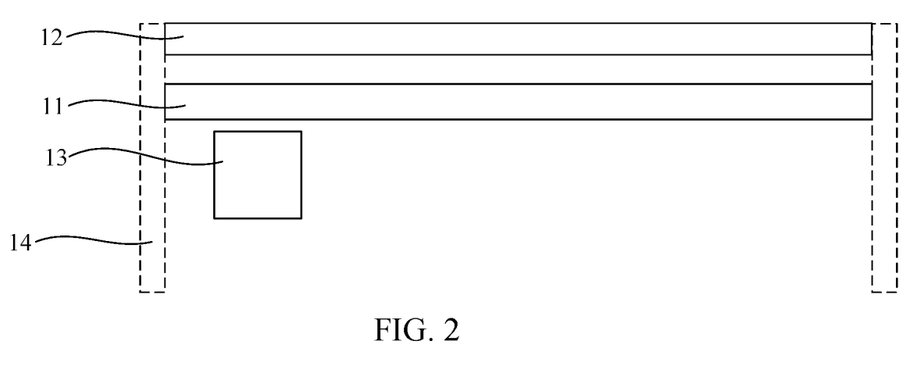
FIG. 2 is a second structural schematic view illustrating a terminal device.

FIGS. 1 and 2 are structural schematic views illustrating a terminal device 100, over which various embodiments or improvements according to the present disclosure can be applied or included. The terminal device 100 can be a mobile phone, a tablet PC, and the like. The terminal device 100 can include a display panel 11, a glass cover 12, an optical sensor 13 and a housing 14. The display panel 11 is located below the glass cover 12. The optical sensor 13 may be located below the display panel 11. The display panel 11 is located in the housing 14. Light emitted by the display panel 11 can pass through the glass cover 12. The display panel 11 may be viewed through the transparent glass cover 12. The display panel 11, for instance, may be an OLED display panel or an LCD display panel, but not limited thereto. The optical sensor 13 is disposed below the display panel 11, which is helpful to enhance the screen-to-body ratio. The optical sensor 13 may be configured to detect the optical parameters of ambient light in an environment provided with the terminal device 100. However, the cost is high to add an independent photosensitive element to detect the optical parameters of the ambient light.

Various embodiments of the present disclosure provide a display panel and a terminal device, which can help reduce the cost of the terminal device in detecting the optical parameters of the ambient light.

Figure 3:
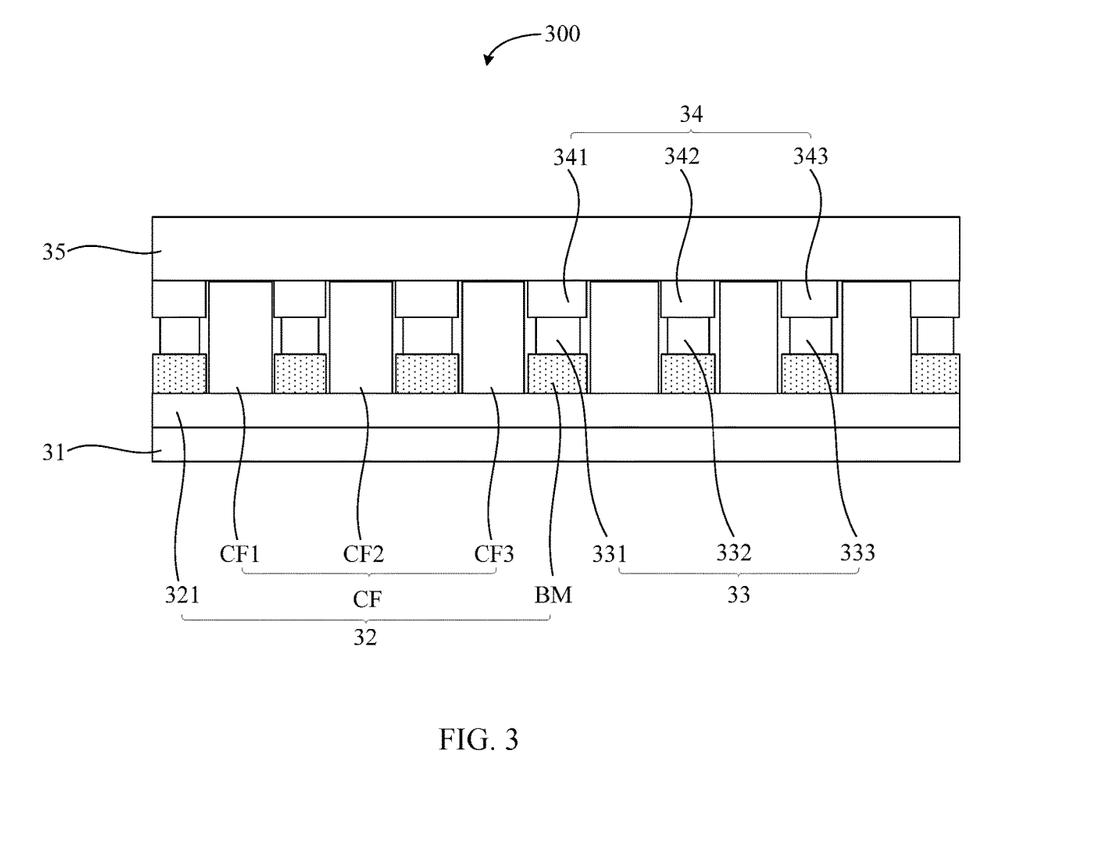
FIG. 3 is a structural schematic view illustrating a display panel according to some embodiments.
Figure 4:
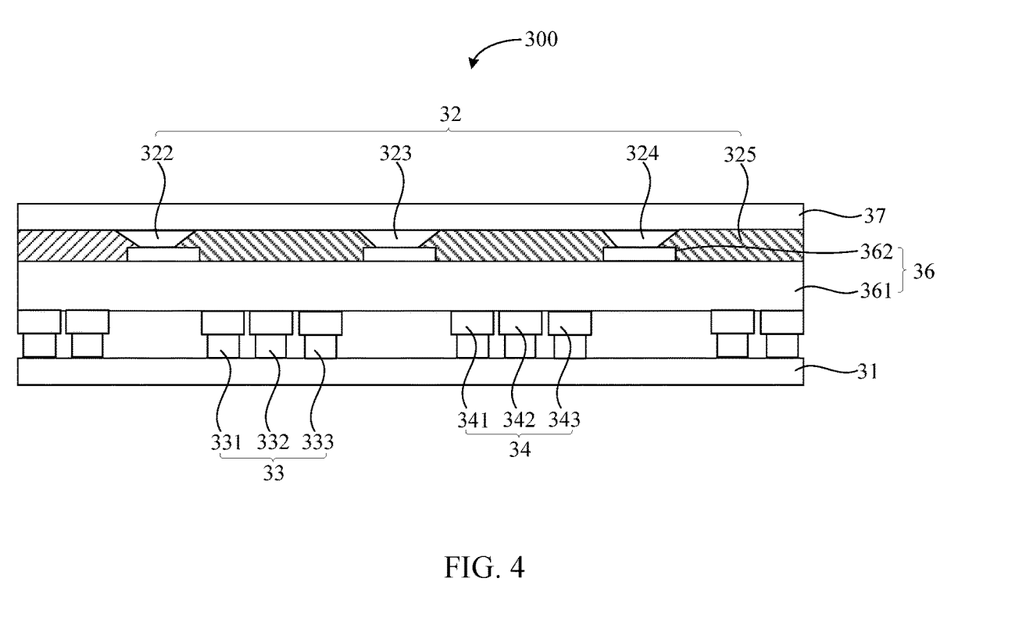
FIG. 4 is a structural schematic view illustrating a display panel according to some embodiments.

Some embodiments of the present disclosure provide a display panel, which may be applied to the terminal device. As shown in FIGS. 3 and 4, the display panel 300 includes: a substrate 31, a pixel layer 32 and a sensing layer 33.

In some embodiments of the present disclosure, the pixel layer 32 is located on the substrate 31 and includes pixel units CF arranged in an array. The sensing layer 33 is located on one side of the substrate 31 away from the pixel layer 32 or located on one side of the substrate 31 close to the pixel layer 32. The sensing layer 33 is configured to convert a received optical signal into an electrical signal.

In some embodiments of the present disclosure, as the sensing layer is located on one side of the substrate away from the pixel layer or located on one side of the substrate close to the pixel layer in the display panel, the sensing layer may be configured to detect the optical parameters of the ambient light. As the cost of integrating the sensing layer in the display panel is lower than that of additionally arranging an independent optical sensor on the outside of the display panel, the cost of the terminal device in detecting the optical parameters of the ambient light can be reduced. Moreover, the screen-to-body ratio of the terminal device can also be enhanced.

In some embodiments, there is no overlap area between a projection of the sensing layer 33 on the substrate 31 and a projection of the pixel unit CF on the substrate 31. Thus, the detection of the ambient light will not affect the display effect and the light emitted by the display panel will not affect the detection of the ambient light.

In some embodiments of the present disclosure, the integration of the sensing layer in the display panel can also avoid the arrangement of the independent optical sensor in the terminal device from affecting the functions of other elements and can improve the overall performances of the terminal device.

In some embodiments, the display panel may be an LCD display panel. In another optional embodiment, the display panel may be an OLED display panel. As the LCD display panel and the OLED display panel have different structures, description will be given below to the LCD display panel and the OLED display panel respectively.

Some embodiments of the present disclosure further provide a display panel. In some embodiments, referring to FIGS. 3 and 5, the display panel 300 may be an LCD display panel. In some embodiments, referring to FIG. 3, the sensing layer 33 is disposed on one side of the substrate 31 close to the pixel layer 32.

In some embodiments, the pixel unit CF includes subpixel units of N colors, in which N is a positive integer, and $1 \leq i \leq N$. There is also no overlap area between the projection of the sensing layer 33 on the substrate 31 and projections of the subpixel units on the substrate 31.

In some embodiments, N may be 3. That is to say, the display panel 300 may include subpixel units of 3 colors. The subpixel units of 3 colors may be a red subpixel unit, a green subpixel unit and a blue subpixel unit. Wherein, the subpixel unit may also be referred to as subpixel. The luminous color of the pixel unit may be determined by the luminous intensity of the subpixel units of 3 colors.

Figure 5:
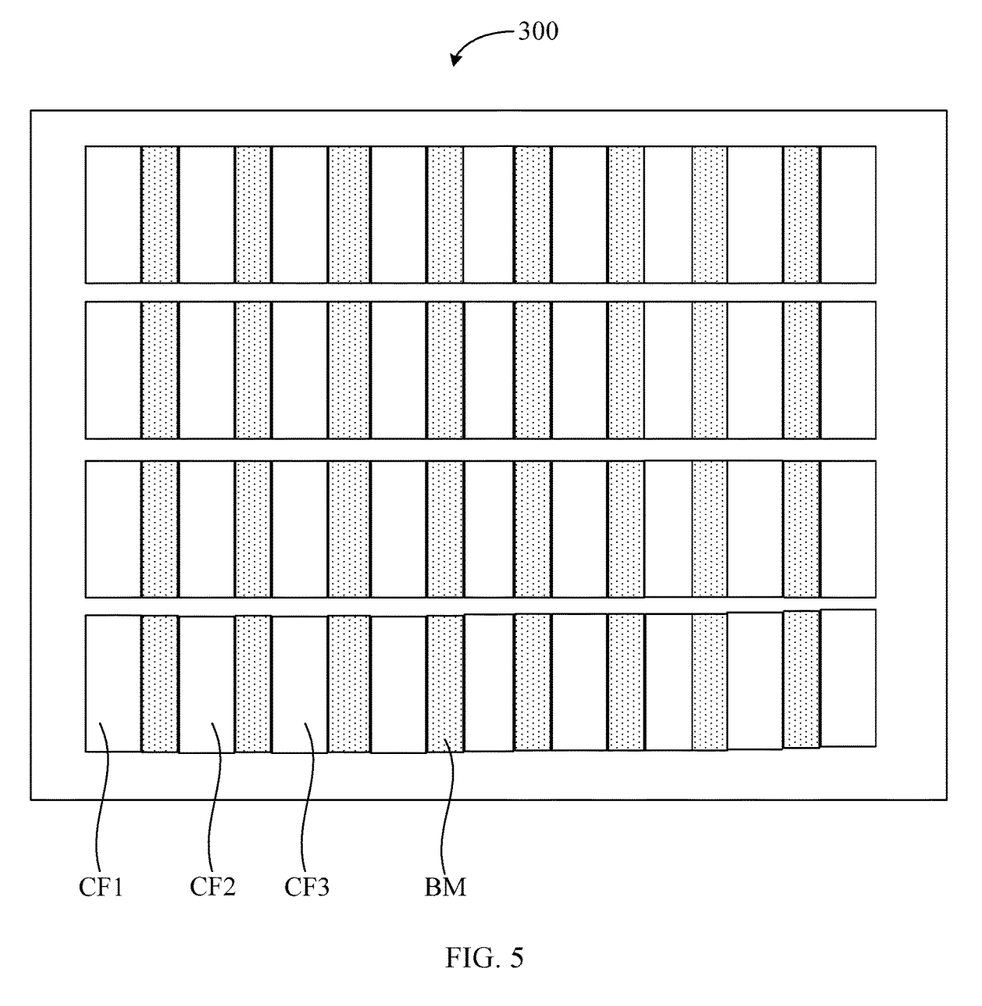
FIG. 5 is a top view of the display panel which is illustrated in FIG. 3.

In some embodiments, referring to FIGS. 3 and 5, the pixel layer 32 may include a liquid crystal layer 321, a color filter layer (not shown) and a Black Matrix BM. The liquid crystal layer 321 may be disposed on the substrate 31. The color filter layer may be disposed on the liquid crystal layer 321 and may include subpixel units of 3 colors CF1, CF2 and CF3 arranged in an array. The Black Matrix BM may be disposed between adjacent subpixel units. The sensing layer 33 may be disposed on the Black Matrix BM and disposed on one side of the Black Matrix BM away from the liquid crystal layer 321. As the Black Matrix BM is disposed between the adjacent subpixel units and the sensing layer 33 is disposed on the Black Matrix BM, it is ensured that there is no overlap area between the projection of the sensing layer on the substrate and the projection of the subpixel units on the substrate, so as to not affect the display effect.

In some embodiments, the subpixel unit CF1 may be a red film layer, the subpixel unit CF2 may be a green film layer, and the subpixel unit CF3 may be a blue film layer. When the liquid crystal layer 321 is in light transmission state, light transmitted from the liquid crystal layer 321 pass through the subpixel unit CF1 and then emitted from the subpixel unit CF1 is red light; light transmitted from the liquid crystal layer 321 pass through the subpixel unit CF2 and then emitted from the subpixel unit CF2 is green light; and light transmitted from the liquid crystal layer 321 pass through the subpixel unit CF3 and then emitted from the subpixel unit CF3 is blue light. The Black Matrix BM is light-proof and configured to isolate the subpixel units CF1, the subpixel units CF2 and the subpixel units CF3.

In some embodiments, the sensing layer 33 may be configured to detect the optical parameters of the ambient light. The photoelectric parameters may be light intensity, chroma, color temperature, and the like. For instance, the sensing layer 33 may be configured to detect the light intensity of the ambient light. The terminal device may adjust the intensity of backlight according to the detected light intensity of the ambient light, so that the display effect of the screen is within a comfortable brightness range acceptable by the human eyes.

In some embodiments, the material of the sensing layer 33 may be indium tin oxide (ITO) or bismuth tungstate ($Bi_2WO_6$), but not limited thereto.

In some embodiments, the sensing layer 33 is integrally formed with the display panel.

It should be noted that the subpixel units of 3 colors may also be subpixel units of other colors. N may also be other numbers, not limited to the cases listed in the embodiments of the present disclosure.

Some embodiments of the present disclosure further provide a display panel. Referring to FIGS. 3 and 5, the display panel 300 is an LCD display panel. The display panel 300 may also include a visible light selective transmission layer 34.

In some embodiments, the visible light selective transmission layer 34 may be disposed on the sensing layer 33 and is configured to allow visible light in a specified wavelength range in the ambient light to pass through and transmit the visible light to the sensing layer 33. Thus, the visible light in the specified wavelength range in the ambient light can pass through the visible light selective transmission layer 34 and be transmitted to the sensing layer 33.

In some embodiments, the visible light selective transmission layer 34 may be an optical grating. The parameters of the optical grating may be determined according to the visible light in the specified wavelength range. The optical grating may be manufactured by ultraviolet irradiation method or other methods. The structure of the above optical grating can be:
ITO/PVK:m-MTDATA(70 nm)/NPB(20 nm)/Alq(50 nm)/LiF(0.5 nm)/Al;
wherein PVK refers to polyvinyl carbazole; m-MTDATA refers to 4,4',4'-tris(N-3-methylphenyl-N-phenylamino)triphenylamine; the doping ratio of PVK to m-MTDATA may be 10:1; NPB refers to N,N'-bis(1-naphthyl)-N,N'-diphenyl-1, 1'-biphenyl-4-4'-diamine; Alq refers to hydroxyquinoline aluminum salt; LiF refers to lithium fluoride; and Al refers to aluminum. The thickness of PVK:m-MTDATA is 70 nm; the thickness of NPB is 20 nm; the thickness of Alq is 50 nm; and the thickness of LiF is 0.5 nm. It should be noted that the structure of the optical grating is not limited to the above structure and may also be other structures.

In some embodiments, the sensing layer 33 includes N sub-sensing layers. The N sub-sensing layers include the first sub-sensing layer, the second sub-sensing layer, ..., the $i^{th}$ sub-sensing layer, ..., the $N^{th}$ sub-sensing layer, in which N is a positive integer, and $1 \leq i \leq N$.

In some embodiments, the visible light selective transmission layer 34 includes N sub-visible light selective transmission layers. The N sub-visible light selective transmission layers include the first sub-visible light selective transmission layer, . . . , the $i^{th}$ sub-visible light selective transmission layer, . . . , the $N^{th}$ sub-visible light selective transmission layer. Wherein, the $i^{th}$ sub-visible light selective transmission layer is disposed on the $i^{th}$ sub-sensing layer and allows visible light in the $i^{th}$ wavelength range to pass through; and the wavelength range of light emitted by subpixel units of the $i^{th}$ color is the same with the $i^{th}$ wavelength range.

In some embodiments, N is 3. The visible light selective transmission layer 34 may allow visible light in the first wavelength range, the second wavelength range and the third wavelength range in the ambient light to pass through. The wavelength range of light emitted by the red subpixel unit is the same with the first wavelength range; the wavelength range of light emitted by the green subpixel unit is the same with the second wavelength range; and the wavelength range of light emitted by the blue subpixel unit is the same with the third wavelength range. Thus, the visible light in other wavelength ranges in the ambient light entering the display panel can be eliminated, and then the display effect can be improved.

In some embodiments, the sensing layer 33 may include a first sub-sensing layer 331, a second sub-sensing layer 332 and a third sub-sensing layer 333. The visible light selective transmission layer 34 may include a first sub-visible light selective transmission layer 341, a second sub-visible light selective transmission layer 342 and a third sub-visible light selective transmission layer 343. The first sub-visible light selective transmission layer 341 may be disposed on the first sub-sensing layer 331; the second sub-visible light selective transmission layer 342 may be disposed on the second sub-sensing layer 332; and the third sub-visible light selective transmission layer 343 may be disposed on the third sub-sensing layer 333.

In some embodiments, the first sub-visible light selective transmission layer 341 may allow the visible light in the first wavelength range to pass through; the second sub-visible light selective transmission layer 342 may allow the visible light in the second wavelength range to pass through; and the third sub-visible light selective transmission layer 343 may allow the visible light in the third wavelength range to pass through. Thus, the visible light in the first wavelength range in the ambient light may pass through the first sub-visible light selective transmission layer 341 and be transmitted to the first sub-sensing layer 331, and the first sub-sensing layer 331 may detect the first light intensity of the visible light in the first wavelength range in the ambient light.

Similarly, the visible light in the second wavelength range in the ambient light may pass through the second sub-visible light selective transmission layer 342 and be transmitted to the second sub-sensing layer 332, and the second sub-sensing layer 332 may detect the second light intensity of the visible light in the second wavelength range in the ambient light.

Similarly, the visible light in the third wavelength range in the ambient light may pass through the third sub-visible light selective transmission layer 343 and be transmitted to the third sub-sensing layer 333, and the third sub-sensing layer 333 may detect the third light intensity of the visible light in the third wavelength range in the ambient light.

Therefore, the terminal device may obtain the optical parameters of the ambient light according to the first light intensity, the second light intensity and the third light intensity. The optical parameters may be light intensity, color temperature or chromaticity coordinate. For instance, the terminal device may obtain the light intensity of the ambient light according to the first light intensity, the second light intensity and the third light intensity. The terminal device may also obtain the color temperature or the chromaticity coordinate of the ambient light according to the first light intensity, the second light intensity and the third light intensity.

In some embodiments, referring to FIG. 3, a projection of the sensing layer 33 on the substrate 31 falls within a projection of the visible light selective transmission layer 34 on the substrate 31. More specifically, a projection of the first sub-sensing layer 331 on the substrate 31 falls within a projection of the first sub-visible light selective transmission layer 341 on the substrate 31; a projection of the second sub-sensing layer 332 on the substrate 31 falls within a projection of the second sub-visible light selective transmission layer 342 on the substrate 31; and a projection of the third sub-sensing layer 333 on the substrate 31 falls within a projection of the third sub-visible light selective transmission layer 343 on the substrate 31. In this way, only light passing through the visible light selective transmission layer 34 can be detected by the sensing layer 33, thereby avoiding visible light except the visible light in the specified wavelength ranges from being transmitted to the sensing layer 33 and improving the accuracy in the detection of the optical parameters of the ambient light.

In some embodiments, the projection area of the sensing layer 33 on the substrate 31 is greater than the specified area. Or in some embodiments, the projections of the sensing layer 33 on the substrate 31 are uniformly distributed and may basically cover the substrate 31. Thus, the photosensitive area is enhanced, and then the sensitivity in the detection of the ambient light can be enhanced. Of course, in some embodiments, the projection area of the sensing layer 33 on the substrate 31 may also be greater than the specified area, and the projections on the substrate 31 are uniformly distributed.

In some embodiments, a surface of the visible light selective transmission layer 34 away from the substrate 31 may be basically level and parallel to a surface of the color filter layer away from the substrate 31. In some embodiments, when the surface of the visible light selective transmission layer 34 away from the substrate 31 and the surface of the color filter layer away from the substrate 31 are not in the same horizontal plane, transparent optical cement may be filled on the surface of the visible light selective transmission layer 34 away from the substrate 31 and the surface of the color filter layer away from the substrate 31 to obtain a planarization layer to provide smooth support for other film layers above.

In some embodiments, referring to FIG. 3, the display panel 300 may also include a polarizer 35 which is configured to avoid the ambient light entering the display panel from being emitted from a light-emitting surface of the display panel and affecting the display effect. In some embodiments, the light-emitting surface of the display panel may be a polarizer side of the display panel.

Figure 6:
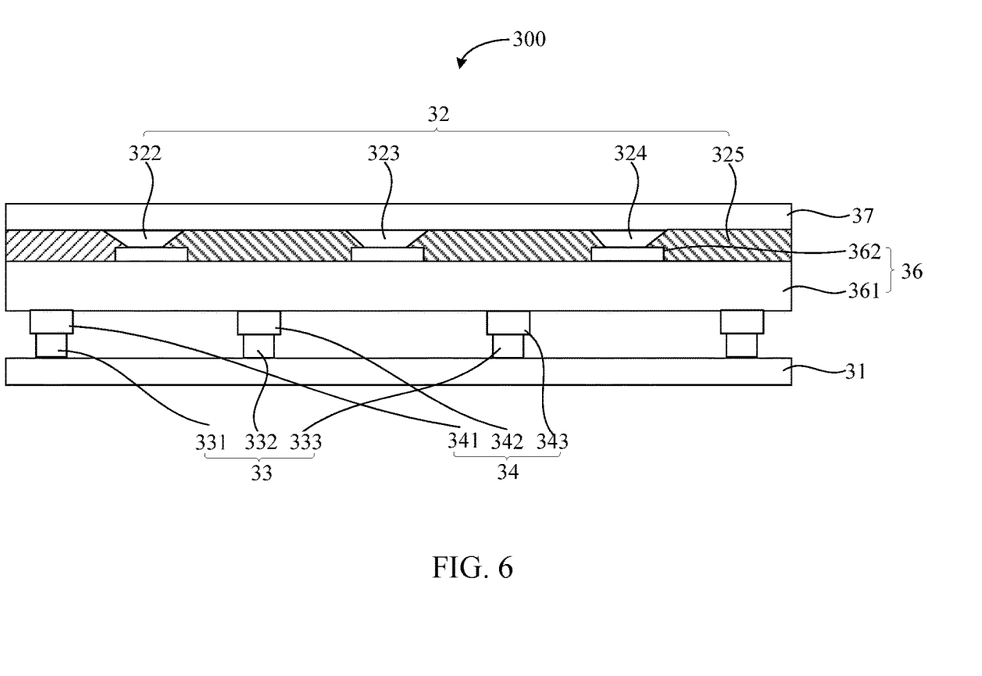
FIG. 6 is a structural schematic view illustrating a display panel according to still another exemplary embodiment.

Some embodiments of the present disclosure further provide a display panel. Referring to FIGS. 4 and 6, the display panel 300 is an OLED display panel.

In some embodiments, the display panel 300 includes a substrate 31, a pixel layer 32, a sensing layer 33 and a visible light selective transmission layer 34. The sensing layer 33 and the visible light selective transmission layer 34 are respectively similar to the sensing layer 33 and the visible light selective transmission layer 34 in some embodiments as shown in FIG. 3, and no further description will be given here.

In some embodiments, the pixel layer 32 includes organic light-emitting layers 322, 323 and 324 and a pixel define layer (PIXEL DEFINITION LAYER) 325. In some embodiments, the display panel 300 also includes an array layer 36 which is disposed between the substrate 31 and the organic light-emitting layers 322, 323 and 324. The organic light-emitting layers 322, 323 and 324 may include organic light-emitting layers 322 of red subpixel units, organic light-emitting layers 323 of green subpixel units, and organic light-emitting layers 324 of blue subpixel units.

In some embodiments, there is no overlap area between projections of the organic light-emitting layers 322, 323 and 324 on the substrate 31 and projections of the first sensing layer 331, the second sensing layer 332 and the third sensing layer 333 on the substrate 31.

In some embodiments, referring to FIG. 4, the first sub-sensing layer 331, the second sub-sensing layer 332 and the third sub-sensing layer 333 may be disposed between organic light-emitting layers of adjacent subpixel units. In some embodiments, referring to FIG. 6, any one of the first sub-sensing layer 331, the second sub-sensing layer 332 and the third sub-sensing layer 333 may also be disposed between organic light-emitting layers of adjacent subpixel units.

In some embodiments, the array layer 36 may include a drive circuit layer 361 and an anode layer 362. The drive circuit layer 361 is disposed on the substrate 31; the anode layer 362 is disposed on the drive circuit layer 361; and the organic light-emitting layers 322, 323 and 324 are disposed on the anode layer 362.

In some embodiments, the sensing layer 33 may be disposed on one side of the substrate 31 away from the pixel layer 32, namely the sensing layer 33 may be disposed on the back of the substrate 31. When the sensing layer 33 is disposed on one side of the substrate 31 away from the pixel layer 32, the substrate 31 is a transparent substrate, and the light transmittance of the array layer 36 is greater than the specified light transmittance. For instance, the specified light transmittance may be 90%, but not limited thereto.

In some embodiments, the sensing layer 33 may also be disposed on one side of the substrate 31 close to the pixel layer 32. When the sensing layer 33 is disposed on one side of the substrate 31 close to the pixel layer 32, the sensing layer 33 may be disposed between the substrate 31 and the array layer 36. Thus, the interference of the array layer to light waves can be reduced, and then the accuracy in detecting the optical parameters of the ambient light can be improved.

Figure 7:
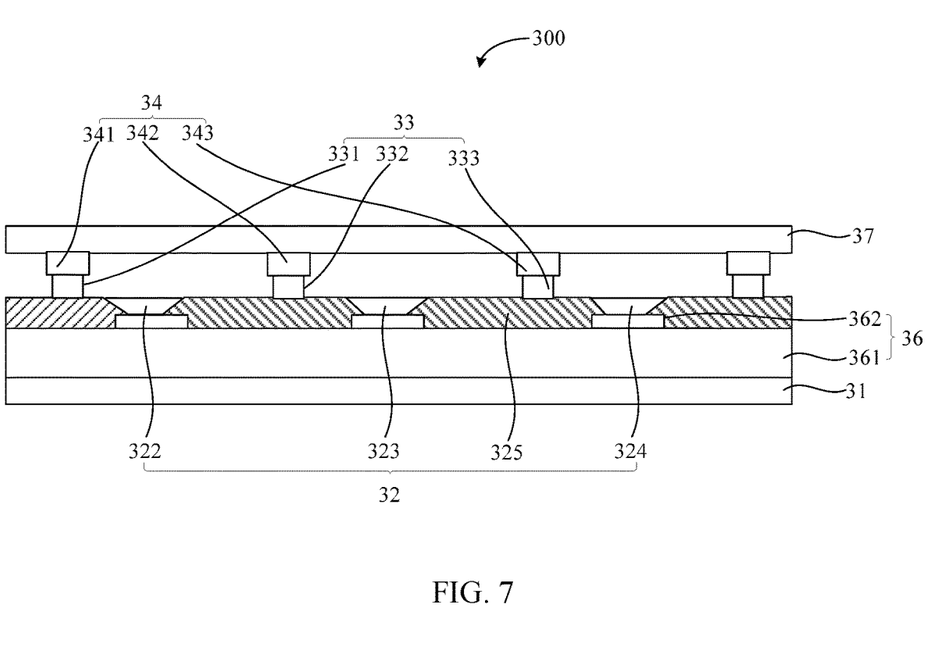
FIG. 7 is a structural schematic view illustrating a display panel according to still another exemplary embodiment.

In some embodiments, referring to FIG. 7, the sensing layer 33 may also be disposed on the pixel definition layer 325. It should be noted that the position of the sensing layer in the display panel may be not limited to the cases listed in some embodiments of the present disclosure.

In some embodiments, referring to FIG. 4, the display panel 300 may also include a cathode layer 37. The cathode layer 37 is disposed on the organic light-emitting layer. The cathode layer 37 may be a planar electrode, so as to simplify the manufacturing process.

Some embodiments of the present disclosure further provide a terminal device. The terminal device may include a device body and the display panel according to any foregoing embodiment. The display panel covers the device body.

In some embodiments, the terminal device also includes a driver chip. The sensing layer 33 is electrically connected with the driver chip. More specifically, the first sub-sensing layer 331, the second sub-sensing layer 332 and the third sub-sensing layer 333 may be electrically connected to the driver chip through leads. The material of the leads may be transparent conductive materials such as ITO, but not limited thereto.

In some embodiments, the driver chip may receive electrical signals from the first sub-sensing layer 331, the second sub-sensing layer 332 and the third sub-sensing layer 333 and acquire the optical parameters of the ambient light according to the received electrical signals, so as to adjust the display effect of the display panel.

It should be noted that the terminal device in some embodiments may be:

any product or component having display function such as a mobile phone, a tablet PC, a notebook computer, a digital album, or a navigator.

In some embodiments, there is no overlap area between a projection of the sensing layer on the substrate and a projection of the pixel unit on the substrate.

In some embodiments, the display panel can also comprise:

a visible light selective transmission layer disposed on the sensing layer and configured to allow visible light in a specified wavelength range in the ambient light to pass through and transmit the visible light to the sensing layer.

In some embodiments, the pixel unit includes subpixel units of N colors;

the sensing layer includes N sub-sensing layers; the N sub-sensing layers include a first sub-sensing layer, . . . , an $i^{th}$ sub-sensing layer, . . . , an $N^{th}$ sub-sensing layer, in which N is a positive integer, and $1 \leq i \leq N$;

the visible light selective transmission layer includes N sub-visible light selective transmission layers; the N sub-visible light selective transmission layers include a first sub-visible light selective transmission layer, . . . , an $i^{th}$ sub-visible light selective transmission layer, . . . , a $N^{th}$ sub-visible light selective transmission layer;

wherein the $i^{th}$ sub-visible light selective transmission layer is disposed on the $i^{th}$ sub-sensing layer and allows visible light in an $i^{th}$ wavelength range to pass through; and a wavelength range of light emitted by the subpixel unit of an $i^{th}$ color is the same with the $i^{th}$ wavelength range.

In some embodiments, a projection of the sensing layer on the substrate may fall within a projection of the visible light selective transmission layer on the substrate.

In some embodiments, the pixel layer may include:

a liquid crystal layer disposed on the substrate;

a color filter layer being disposed on the liquid crystal layer and including subpixel units of N colors arranged in an array; and black matrix disposed between adjacent subpixel units;

wherein the sensing layer is disposed on the black matrix and disposed on one side of the black matrix away from the liquid crystal layer.

In some embodiments, the pixel layer may include an organic light-emitting layer; the display panel further comprises:

an array layer disposed between the substrate and the organic light-emitting layer;

when the sensing layer is disposed on one side of the substrate away from the pixel layer, the substrate is a transparent substrate, and a light transmittance of the array layer is greater than a specified light transmittance; and/or when the sensing layer is disposed on one side of the substrate close to the pixel layer, the sensing layer is disposed between the substrate and the array layer.

In some embodiments, a projection area of the sensing layer on the substrate may be greater than a specified area; and/or a projection of the sensing layer on the substrate may be uniformly distributed.

In some embodiments, the visible light selective transmission layer may include an optical grating.

In some embodiments, the terminal device may also comprise a driver chip, wherein the sensing layer is electrically connected with the driver chip.

Various embodiments of the present disclosure can have one or more of the following advantages.

As the sensing layer is disposed on one side of the substrate away from the pixel layer or disposed on one side of the substrate close to the pixel layer in the display panel, the foregoing sensing layer may be configured to detect the optical parameters of ambient light. Since the cost of integrating the sensing layer in the display panel is lower than that of separately arranging an independent optical sensor on the outside of the display panel, the cost of the terminal device in detecting the optical parameters of the ambient light can be reduced.

It is to be noted that in the accompanying drawings, the dimension of layers and regions may be exaggerated for clarity of illustration. It is also understood that when an element or layer is referred to as "on" another element or layer, it may be directly on the other element or an intermediate layer may be present. In addition, it is to be understood that when an element or layer is referred to as "under" another element or layer, it may be directly beneath the other element or more than one intermediate layer or elements may be present. In addition, it is to be understood that when a layer or element is referred to as being "between" two layers or two elements, it may be a single layer between two layers or two elements, or more than one intermediate layer or elements may be present. Similar reference numerals indicate similar elements.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable sub combination.

Moreover, although features can be described above as acting in certain combinations and even initially claimed as such, one or more features from a claimed combination can in some cases be excised from the combination, and the claimed combination can be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A display panel, comprising:
    a substrate;
    a pixel layer disposed over the substrate and including pixel units arranged in an array;
    a photoelectric sensing layer, integrally formed with the display panel and disposed at a side of the substrate distal from the pixel layer or disposed at a side of the substrate proximal to the pixel layer; and
    a visible light selective transmission layer disposed on the photoelectric sensing layer and configured to allow visible light in a specified wavelength range in an ambient light to pass through and transmit the visible light to the photoelectric sensing layer, the visible light selective transmission layer being an optical grating structure,
    wherein the photoelectric sensing layer is configured to detect optical parameters of ambient light, and convert a received optical signal into an electrical signal without being affected by light emitted by the display panel thereby adjusting a display effect of the display panel, and
    wherein a projection of the photoelectric sensing layer on the substrate falls within a projection of the visible light selective transmission layer on the substrate.

2. The display panel according to claim 1, wherein the pixel layer includes:
    a liquid crystal layer disposed on the substrate;
    a color filter layer being disposed on the liquid crystal layer and including subpixel units of N colors arranged in an array; and
    a black matrix disposed between adjacent subpixel units;
    the photoelectric sensing layer is disposed on the black matrix and disposed on one side of the black matrix away from the liquid crystal layer.

3. The display panel according to claim 1, wherein the pixel layer includes:
    a liquid crystal layer disposed on the substrate;
    a color filter layer being disposed on the liquid crystal layer and including subpixel units of N colors arranged in an array; and
    a black matrix disposed between adjacent subpixel units;
    the photoelectric sensing layer is disposed on the black matrix and disposed on one side of the black matrix away from the liquid crystal layer.

4. The display panel according to claim 1, wherein the pixel layer includes an organic light-emitting layer; the display panel further comprises:
    an array layer disposed between the substrate and the organic light-emitting layer;
    when the photoelectric sensing layer is disposed on one side of the substrate away from the pixel layer, the substrate is a transparent substrate, and a light transmittance of the array layer is greater than a specified light transmittance; and/or
    when the photoelectric sensing layer is disposed on one side of the substrate close to the pixel layer, the photoelectric sensing layer is disposed between the substrate and the array layer.

5. The display panel according to claim 1, wherein the pixel layer includes an organic light-emitting layer; the display panel further comprises:
    an array layer disposed between the substrate and the organic light-emitting layer;
    when the photoelectric sensing layer is disposed on one side of the substrate away from the pixel layer, the substrate is a transparent substrate, and a light transmittance of the array layer is greater than a specified light transmittance; and/or
    when the photoelectric sensing layer is disposed on one side of the substrate close to the pixel layer, the photoelectric sensing layer is disposed between the substrate and the array layer.

6. The display panel according to claim 1, wherein a projection area of the photoelectric sensing layer on the substrate is greater than a specified area.

7. The display panel according to claim 1, wherein the visible light selective transmission layer includes an optical grating.

8. A mobile phone comprising display panel according to claim 1, wherein the mobile phone is configured to adjust a screen brightness of the display panel based on optical parameters of ambient light detected by the photoelectric sensing layer without an independent optical sensor outside of the display panel.

9. A terminal device, comprising:
    a device body; and
    a display panel according to claim 1;
    wherein the display panel covers the device body.

10. The terminal device according to claim 9, further comprising:
    a driver chip,
    wherein the photoelectric sensing layer is electrically connected with the driver chip.

11. The display panel according to claim 1, wherein there is no overlap area between the projection of the photoelectric sensing layer on the substrate and a projection of the pixel unit on the substrate.

12. The display panel according to claim 11, wherein the pixel layer includes:
    a liquid crystal layer disposed on the substrate;
    a color filter layer being disposed on the liquid crystal layer and including subpixel units of N colors arranged in an array; and
    a black matrix disposed between adjacent subpixel units;
    the photoelectric sensing layer is disposed on the black matrix and disposed on one side of the black matrix away from the liquid crystal layer.

13. The display panel according to claim 11, wherein the pixel layer includes an organic light-emitting layer; the display panel further comprises:
- an array layer disposed between the substrate and the organic light-emitting layer;
- when the photoelectric sensing layer is disposed on one side of the substrate away from the pixel layer, the substrate is a transparent substrate, and a light transmittance of the array layer is greater than a specified light transmittance; and/or
- when the photoelectric sensing layer is disposed on one side of the substrate close to the pixel layer, the photoelectric sensing layer is disposed between the substrate and the array layer.

14. The display panel according to claim 1, wherein the pixel unit includes subpixel units of N colors;
- the photoelectric sensing layer includes N sub-photoelectric sensing layers;
- the N sub-photoelectric sensing layers include an $i^{th}$ sub-sensing layer, in which $1 \leq i \leq N$ and N is a positive integer;
- the visible light selective transmission layer includes N sub-visible light selective transmission layers; the N sub-visible light selective transmission layers include an $i^{th}$ sub-visible light selective transmission layer;
- wherein the $i^{th}$ sub-visible light selective transmission layer is disposed on the $i^{th}$ sub-photoelectric sensing layer and allows visible light in an $i^{th}$ wavelength range to pass through; and a wavelength range of light emitted by a subpixel unit of an $i^{th}$ color is the same with the $i^{th}$ wavelength range.

15. The display panel according to claim 14, wherein the pixel layer includes:
- a liquid crystal layer disposed on the substrate;
- a color filter layer being disposed on the liquid crystal layer and including subpixel units of N colors arranged in an array; and
- a black matrix disposed between adjacent subpixel units;
- the photoelectric sensing layer is disposed on the black matrix and disposed on one side of the black matrix away from the liquid crystal layer.

16. The display panel according to claim 14, wherein the pixel layer includes an organic light-emitting layer; the display panel further comprises:
- an array layer disposed between the substrate and the organic light-emitting layer;
- when the photoelectric sensing layer is disposed on one side of the substrate away from the pixel layer, the substrate is a transparent substrate, and a light transmittance of the array layer is greater than a specified light transmittance; and/or
- when the photoelectric sensing layer is disposed on one side of the substrate close to the pixel layer, the photoelectric sensing layer is disposed between the substrate and the array layer.

* * * * *